US012632091B2

(12) United States Patent     (10) Patent No.:   US 12,632,091 B2
Gwak et al.                (45) Date of Patent:     May 19, 2026

(54) ELASTIC MEMBER AND DISPLAY DEVICE COMPRISING SAME

(71) Applicant: LG INNOTEK CO., LTD., Seoul (KR)

(72) Inventors: Jung Min Gwak, Seoul (KR); Sung Won Kang, Seoul (KR); Sang Jun Ko, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 191 days.

(21) Appl. No.: 18/702,445

(22) PCT Filed: Sep. 30, 2022

(86) PCT No.: PCT/KR2022/014776
§ 371 (c)(1),
(2) Date: Apr. 18, 2024

(87) PCT Pub. No.: WO2023/068595
PCT Pub. Date: Apr. 27, 2023

(65) Prior Publication Data
US 2024/0427386 A1     Dec. 26, 2024

(30) Foreign Application Priority Data

Oct. 21, 2021    (KR) ........................ 10-2021-0141391

(51) Int. Cl.
*G06F 1/16*       (2006.01)
*H10K 77/10*      (2023.01)
*H10K 102/00*    (2023.01)

(52) U.S. Cl.
CPC .......... *G06F 1/1681* (2013.01); *G06F 1/1652* (2013.01); *H10K 77/111* (2023.02); *H10K 2102/311* (2023.02)

(58) Field of Classification Search
CPC combination set(s) only.
See application file for complete search history.

(56) References Cited

U.S. PATENT DOCUMENTS

| | | | |
|---|---|---|---|
| 11,175,693 B2 | 11/2021 | Song et al. | |
| 11,656,655 B2 * | 5/2023 | Shin ..................... | G06F 1/1641 |
| | | | 361/679.27 |

(Continued)

FOREIGN PATENT DOCUMENTS

| | | |
|---|---|---|
| KR | 10-2016-0144912 | 12/2016 |
| KR | 10-2019-0081341 | 7/2019 |

(Continued)

OTHER PUBLICATIONS

International Search Report dated Jan. 10, 2023 issued in Application No. PCT/KR2022/014776.

(Continued)

*Primary Examiner* — Lisa Lea-Edmonds
(74) *Attorney, Agent, or Firm* — KED & ASSOCIATES, LLP

(57) ABSTRACT

An elastic member according to an embodiment includes a first region and a second region, wherein a first direction defined as a width direction and a second direction defined as a longitudinal direction in the elastic member, the first region is defined as a folding region that is folded with the first direction as a folding axis, and the second region is defined as an unfolding region, a first pattern portion including a plurality of patterns is disposed in the first region, a length of the plurality of patterns in the first direction is greater than a width of the plurality of patterns in the second direction, the first region includes a first column, a second column, and a third column that extend in the first direction and are sequentially disposed in the second direction around the folding axis, the first region includes a plurality of pattern groups respectively disposed in the plurality of columns of the first region and including the plurality of patterns spaced apart from each other in the first direction, (Continued)

and a size of a pattern of the first column is different from a size of a pattern of the second column.

16 Claims, 11 Drawing Sheets

(56) References Cited

U.S. PATENT DOCUMENTS

| | | | | |
|---|---|---|---|---|
| 11,977,414 | B2 * | 5/2024 | Park | H04M 1/0268 |
| 12,197,255 | B2 * | 1/2025 | Park | G06F 1/1656 |
| 12,235,681 | B2 * | 2/2025 | Park | G09F 9/301 |
| 12,324,134 | B2 * | 6/2025 | Ko | G06F 1/1637 |
| 2014/0029212 | A1 | 1/2014 | Hwang et al. | |
| 2022/0011819 | A1 * | 1/2022 | Shin | G06F 1/1641 |
| 2023/0018777 | A1 * | 1/2023 | Park | G06F 1/1656 |
| 2023/0182433 | A1 * | 6/2023 | Park | G09F 9/301 428/12 |
| 2023/0195169 | A1 * | 6/2023 | Park | H04M 1/0268 |
| 2023/0288959 | A1 * | 9/2023 | Park | G06F 1/1641 |
| 2023/0301043 | A1 * | 9/2023 | Ko | G06F 1/203 |
| 2023/0405972 | A1 * | 12/2023 | Ko | H10K 77/00 |
| 2024/0012453 | A1 * | 1/2024 | Gwak | G06F 1/1652 |
| 2024/0081003 | A1 * | 3/2024 | Wang | H05K 5/0217 |
| 2024/0357900 | A1 * | 10/2024 | Ko | B32B 3/266 |
| 2024/0370056 | A1 * | 11/2024 | Kang | G06F 3/041 |
| 2024/0427386 | A1 * | 12/2024 | Gwak | G06F 1/1681 |
| 2025/0103102 | A1 * | 3/2025 | Park | G06F 1/1652 |
| 2025/0261351 | A1 * | 8/2025 | Ko | H10K 59/80 |

FOREIGN PATENT DOCUMENTS

| | | |
|---|---|---|
| KR | 10-2086469 | 3/2020 |
| KR | 10-2020-0064376 | 6/2020 |
| KR | 10-2020-0108754 | 9/2020 |
| KR | 10-2181655 | 11/2020 |
| KR | 10-2021-0085131 | 7/2021 |

OTHER PUBLICATIONS

Korean Office Action dated Nov. 19, 2025 issued in Application No. 10-2021-0141391.

* cited by examiner

【FIG. 1】
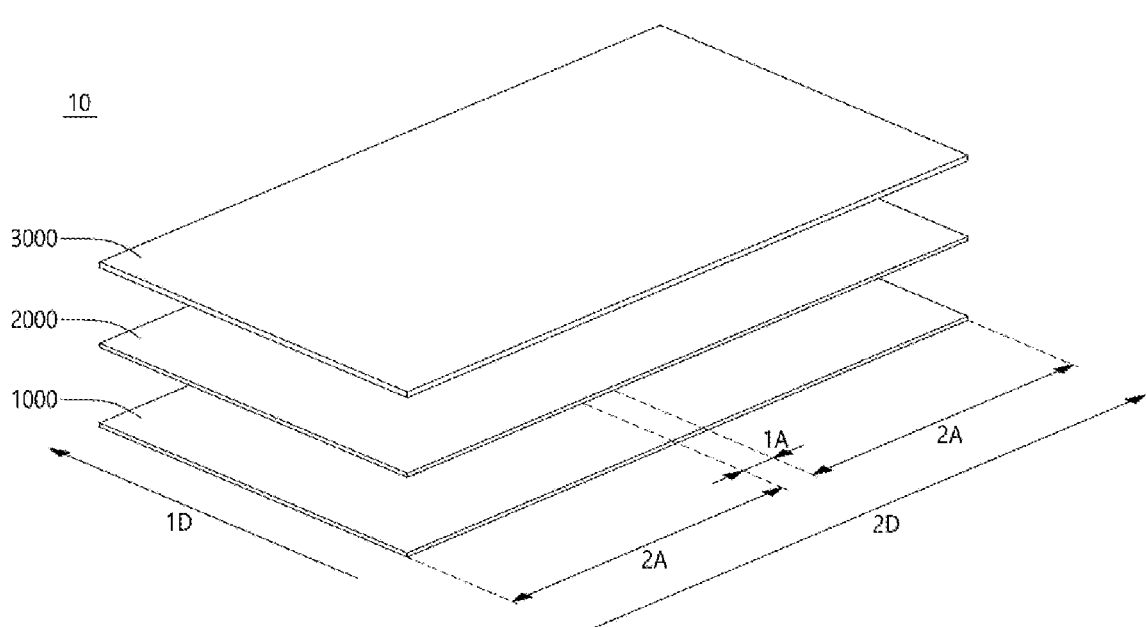

【FIG. 2】
1000
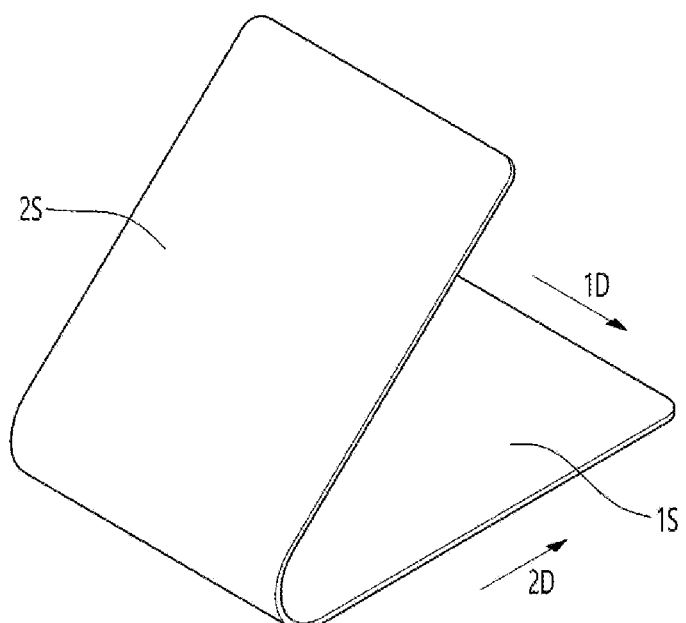

【FIG. 3】
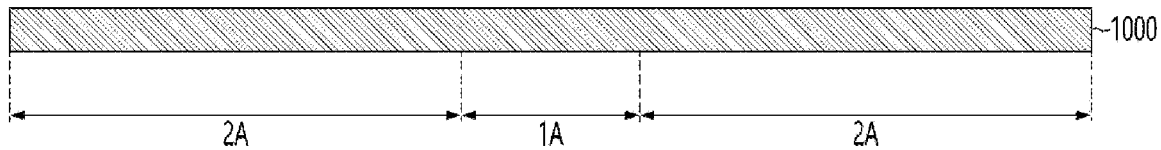
【FIG. 4】
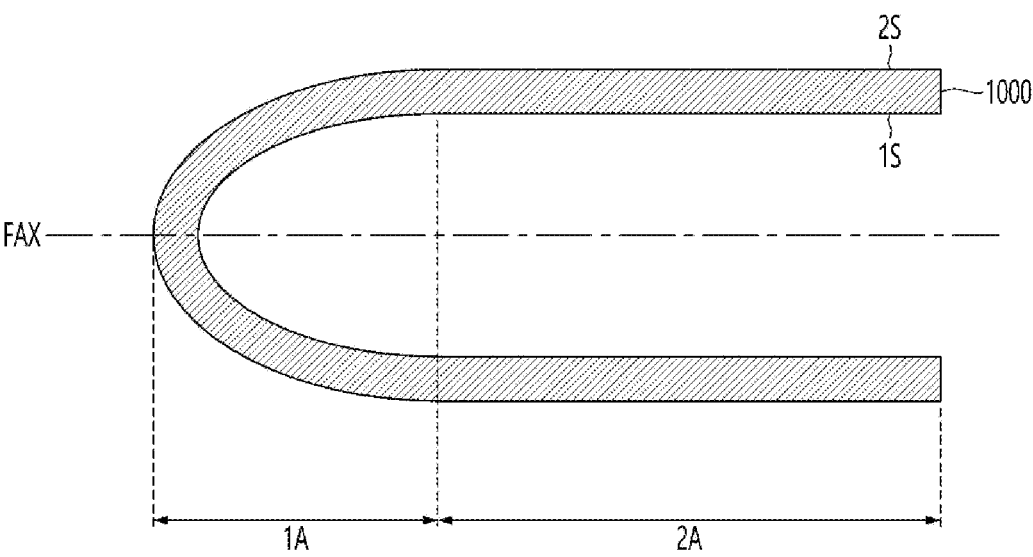
【FIG. 5】
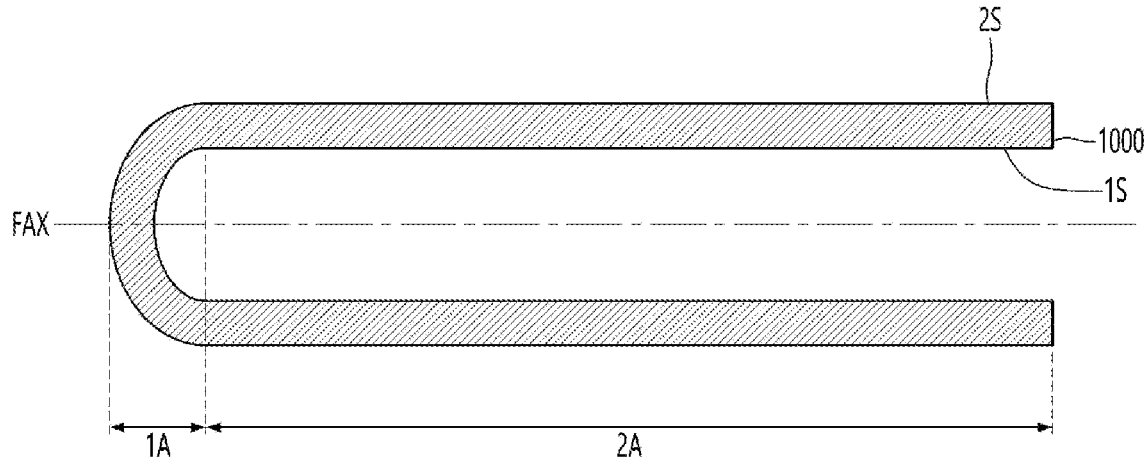

【FIG. 6】
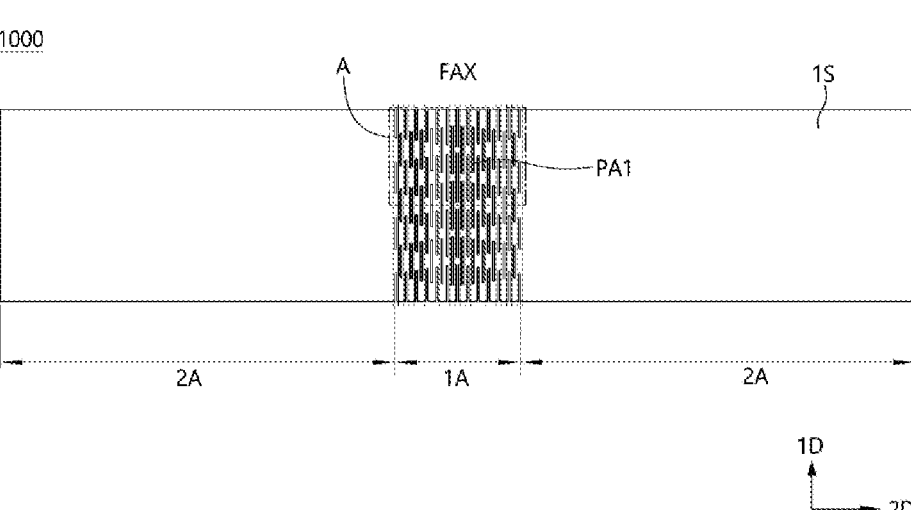

【FIG. 7】
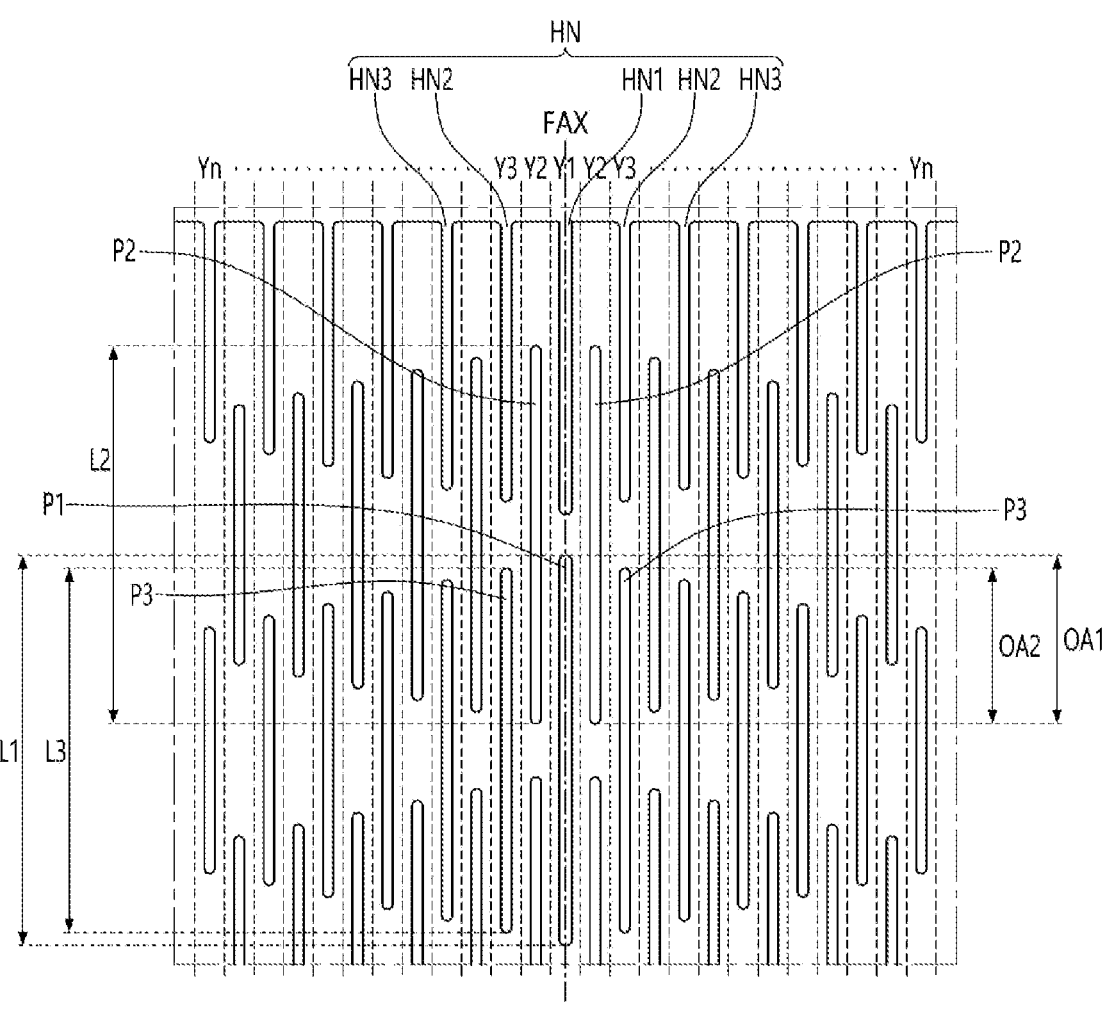

【FIG. 8】
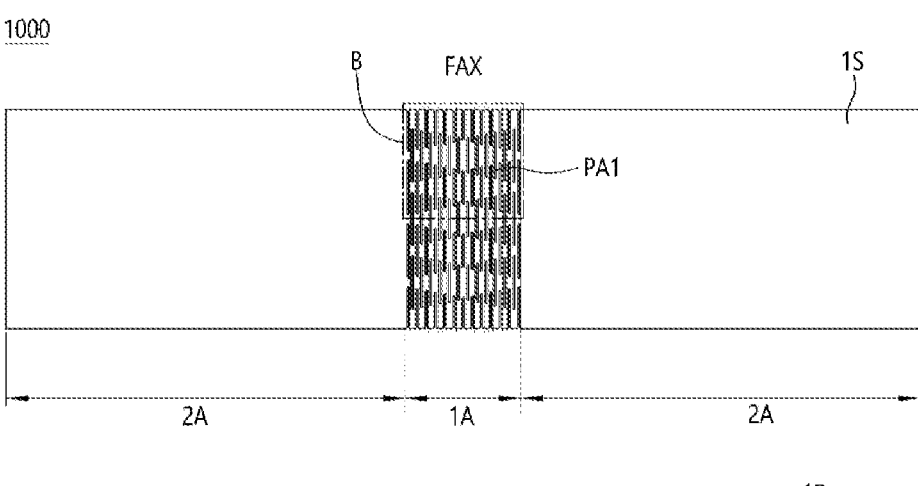

【FIG. 9】
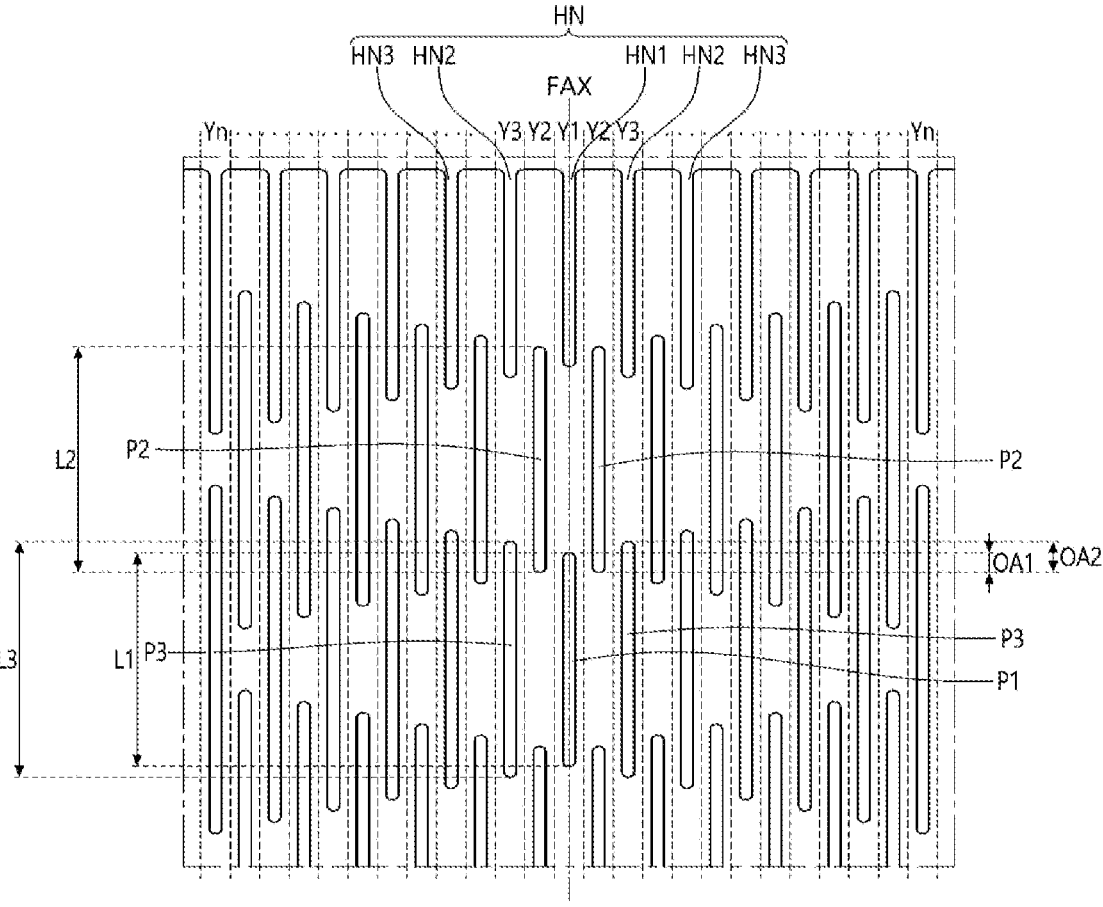
【FIG. 10】
10
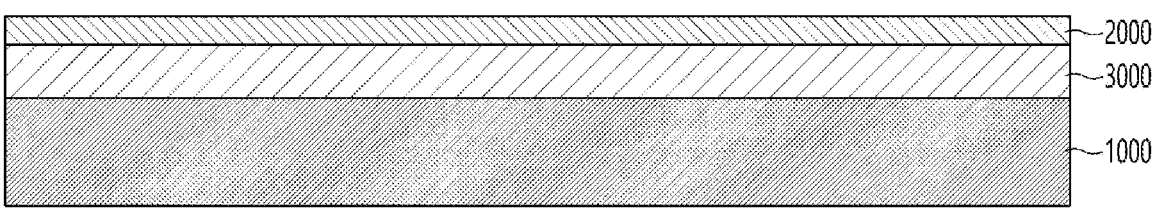

【FIG. 11】
10
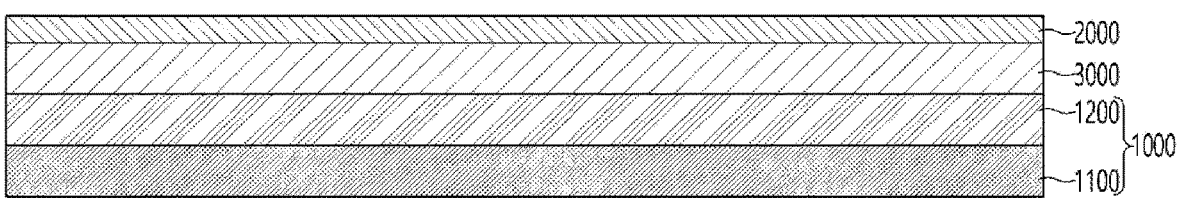
【FIG. 12】
10
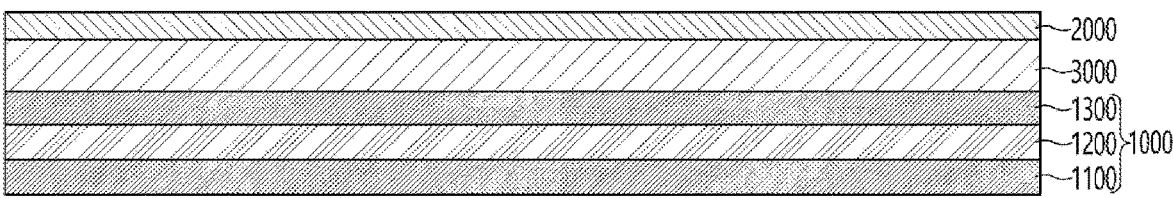
【FIG. 13】
10
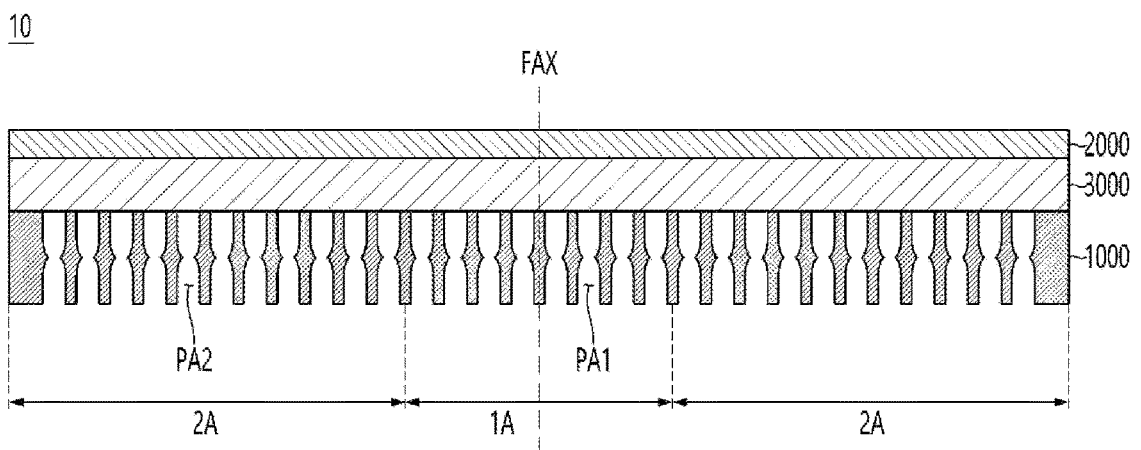

【FIG. 14】
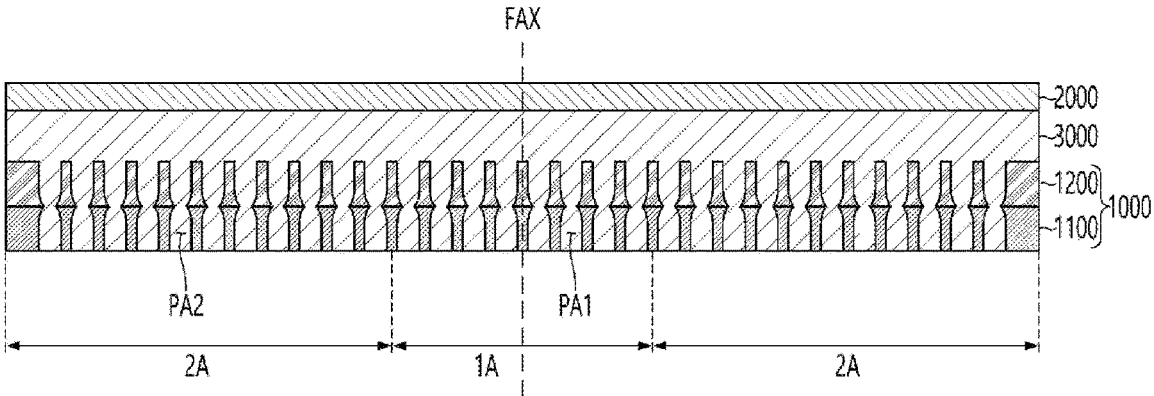
【FIG. 15】
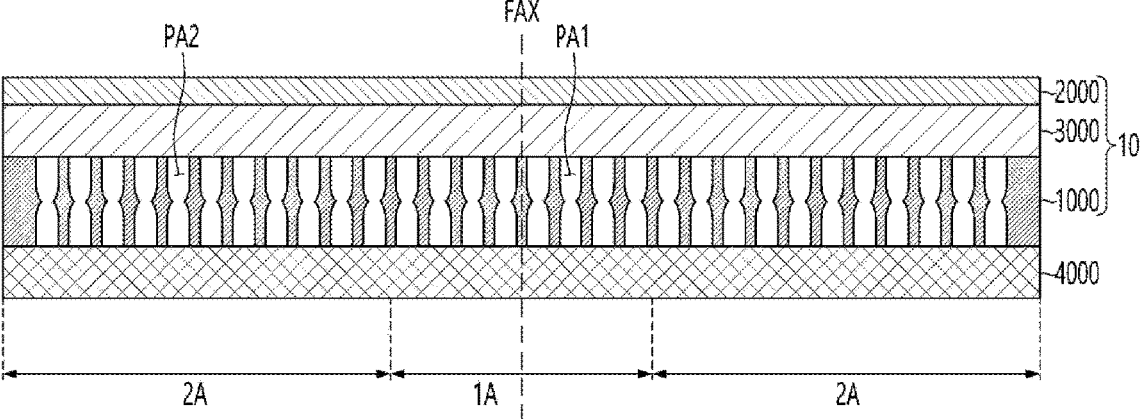
【FIG. 16】
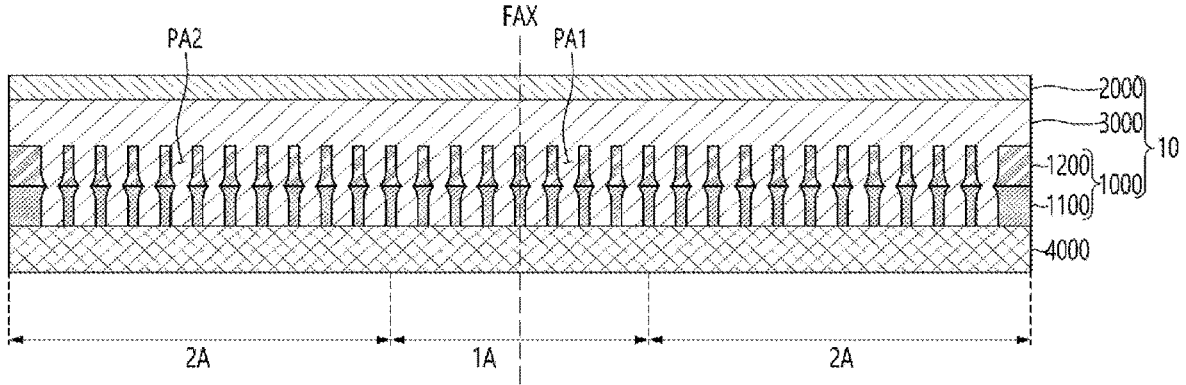

【FIG. 17】
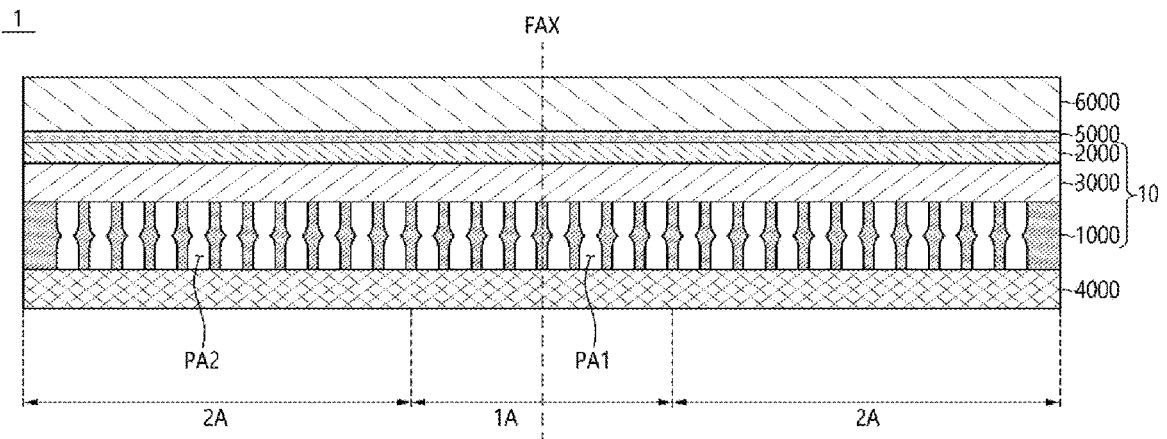
【FIG. 18】
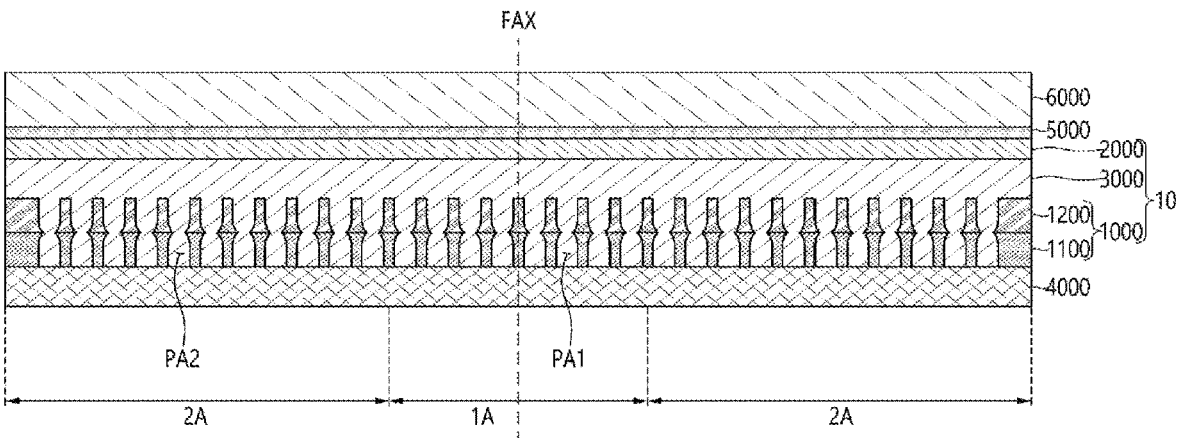

【FIG. 19】
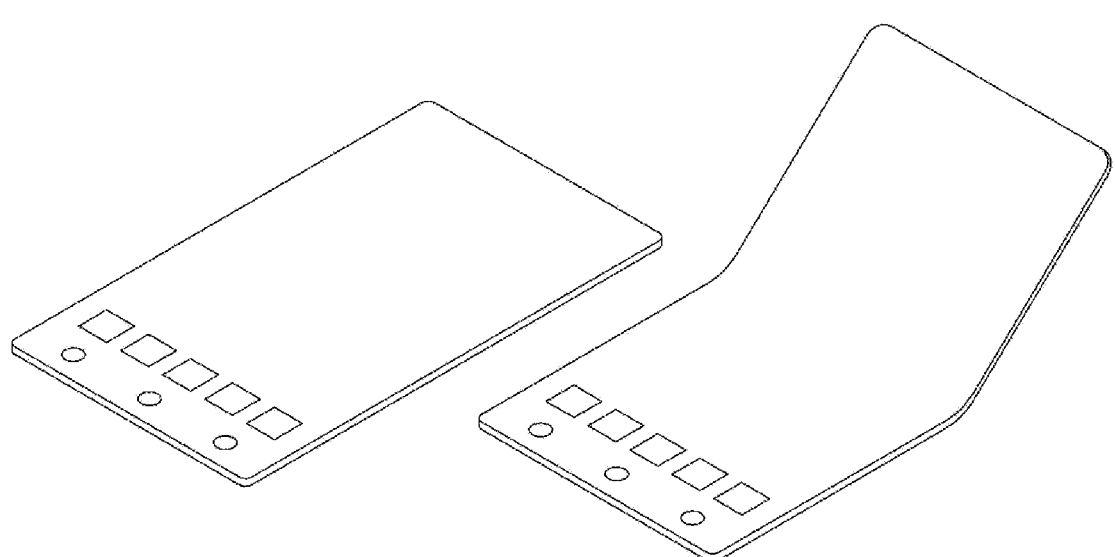

ELASTIC MEMBER AND DISPLAY DEVICE COMPRISING SAME

CROSS-REFERENCE TO RELATED PATENT APPLICATIONS

This application is a U.S. National Stage Application under 35 U.S.C. § 371 of PCT Application No. PCT/KR2022/014776, filed Sep. 30, 2022, which claims priority to Korean Patent Application No. 10-2021-0141391, filed Oct. 21, 2021, whose entire disclosures are hereby incorporated by reference.

TECHNICAL FIELD

Embodiments relate to an elastic member and a display device including the same.

BACKGROUND

Recently, there is an increasing demand for a flexible or foldable display device capable of easily carrying various applications and displaying an image on a large screen when being carried.

Such a flexible or foldable display device is folded or partially bent when being carried or stored, and may be implemented with the display unfolded when displaying images. Accordingly, an image display region may be increased, and a user may easily carry the display.

After the flexible or foldable display device is folded or bent, a restoration process of unfolding the flexible display device again may be repeated.

In a folding region of the flexible or foldable display device, compressive stress or tensile stress may occur due to folding. Accordingly, in order to prevent cracks due to stress in the folding region, a plurality of pattern portions capable of reducing and distributing stress may be formed in the folding region.

For example, the stress generated in the folding region may be reduced by forming hole or groove-shaped pattern portions in the folding region.

Meanwhile, a distribution of the stress in the folding region may vary depending on a folding shape. That is, depending on the folding shape, the stress may increase or decrease from a center of the folding region toward the outside.

Accordingly, when the pattern portions formed in the folding region are disposed in regular sizes, and when the flexible or foldable display device has various folding shapes, and accordingly, the stress may not be effectively reduced.

Therefore, there is a need for an elastic member having a new structure capable of solving the above problems.

SUMMARY

Technical Problem

An embodiment is directed to providing an elastic member having improved folding reliability even in various folding shapes and a display device including the same.

Technical Solution

An elastic member according to an embodiment includes a first region and a second region, wherein a first direction defined as a width direction and a second direction defined as a longitudinal direction in the elastic member, the first region is defined as a folding region that is folded with the first direction as a folding axis, and the second region is defined as an unfolding region, a first pattern portion including a plurality of patterns is disposed in the first region, a length of the plurality of patterns in the first direction is greater than a width of the plurality of patterns in the second direction, the first region includes a first column, a second column, and a third column that extend in the first direction and are sequentially disposed in the second direction around the folding axis, the first region includes a plurality of pattern groups respectively disposed in the plurality of columns of the first region and including the plurality of patterns spaced apart from each other in the first direction, and a size of a pattern of the first column is different from a size of a pattern of the second column.

Advantageous Effects

An elastic member according to an embodiment can change a size of a pattern and a hinge portion disposed in each column according to a distance from a folding axis.

In detail, as it goes away from the folding axis, a length of the pattern and a length of the hinge portion can be decreased or increased. In addition, as it goes away from the folding axis, a length of an overlapping region of patterns and a length of an overlapping region of the hinge portion can be decreased or increased.

Accordingly, in the elastic member according to the first embodiment, an area of a first pattern portion including the pattern and an area of the hinge portion can increase or decrease as it approaches the folding axis. Therefore, in the elastic member according to the embodiment, the area of the first pattern portion configured to relieve stress according to a shape of a first region that is a folding region of can be controlled.

That is, when the first region of the elastic member according to the embodiment is formed in a shape in which a curvature decreases, that is, a radius of curvature increases as it goes away from the folding axis, it is possible to improve the folding reliability and the flatness of the elastic member.

Alternatively, when the first region of the elastic member according to the embodiment is formed in a shape in which a curvature increases, that is, a radius of curvature decreases as it goes away from the folding axis, it is possible to improve the folding reliability and the flatness of the elastic member.

That is, by forming the area of the first pattern portion and the hinge portion to be decreased or increased as it goes away from the folding axis of the elastic member, the first pattern portion and the hinge portion can be formed to be suitable for a distribution of stress according to a folding shape of the elastic member.

Therefore, the folding reliability and the flatness of the elastic member according to the embodiment can be improved.

BRIEF DESCRIPTION OF THE DRAWINGS

FIG. 1 is a perspective view of a display device according to an embodiment.

FIG. 2 is a perspective view of an elastic member according to an embodiment.

FIG. 3 is a side view of the elastic member according to the embodiment before folding.

FIGS. 4 and 5 are side views of the elastic member according to the embodiment after folding.

FIG. 6 is a top view of an elastic member according to a first embodiment.

FIG. 7 is an enlarged view of region A of FIG. 6.

FIG. 8 is a top view of an elastic member according to a second embodiment.

FIG. 9 is an enlarged view of region B of FIG. 7.

FIGS. 10 to 12 are cross-sectional views for describing a layer structure of an elastic member according to an embodiment.

FIGS. 13 and 14 are cross-sectional views for describing an arrangement structure of an elastic member according to an embodiment.

FIGS. 15 and 16 are cross-sectional views of a flexible support including an elastic member according to an embodiment.

FIGS. 17 and 18 are cross-sectional views of a display device including the flexible support according to the embodiment.

FIG. 19 is a view for describing an example in which the display device according to the embodiment is applied.

DETAILED DESCRIPTION OF THE EMBODIMENTS

Hereinafter, embodiments of the present disclosure will be described in detail with reference to the accompanying drawings. However, the spirit and scope of the present disclosure is not limited to a part of the embodiments described, and may be implemented in various other forms, and within the spirit and scope of the present disclosure, one or more of the elements of the embodiments may be selectively combined and replaced. In addition, unless expressly otherwise defined and described, the terms used in the embodiments of the present disclosure (including technical and scientific terms) may be construed the same meaning as commonly understood by one of ordinary skill in the art to which the present disclosure belongs, and the terms such as those defined in commonly used dictionaries may be interpreted as having a meaning that is consistent with their meaning in the context of the relevant art.

In addition, the terms used in the embodiments of the present disclosure are for describing the embodiments and are not intended to limit the present disclosure. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present disclosure, the terms such as first, second, A, B, (a), and (b) may be used. These terms are only used to distinguish the elements from other elements, and the terms are not limited to the essence, order, or order of the elements.

In addition, when an element is described as being "connected" or "coupled" to another element, it may include not only when the element is directly "connected" or "coupled" to other elements, but also when the element is "connected" or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, an elastic member according to an embodiment and a folding support and a display device including the same will be described with reference to the drawings.

FIG. 1 is a perspective view of a display device according to an embodiment, and FIGS. 2 to 4 are a perspective view and cross-sectional views of the elastic member according to the embodiment.

Referring to FIG. 1, a display device 10 according to the embodiment may include an elastic member 1000, a display panel 2000 disposed on the elastic member 1000, and a touch panel 3000.

The elastic member 1000 may support the display panel 2000 and the touch panel 3000. That is, the elastic member 1000 may be a support substrate supporting the display panel 2000 and the touch panel 3000.

Meanwhile, the touch panel 3000 may be integrally formed with the display panel 2000. For example, the touch panel 3000 may be integrally formed with the display panel 2000 in an on-cell or in-cell method.

The elastic member 1000 may include a metallic material and a non-metallic material. In detail, the elastic member 1000 may be formed of a single layer or a plurality of layers, and the single layer or the plurality of layers may include at least one of a metallic material and the non-metallic material. For example, the elastic member 1000 may include metal, metal alloy, plastic, a composite material (e.g., carbon fiber reinforced plastic, a magnetic or conductive material, a glass fiber reinforced material, etc.), ceramic, sapphire, or glass.

The elastic member 1000 may be flexible or foldable. That is, the elastic member 1000 may be folded or bent in one direction. That is, the elastic member 1000 may be a substrate for display applied to a flexible display device or a foldable display device.

In the elastic member 1000, a first direction 1D and a second direction 2D that is different from the first direction 1D may be defined. For example, the first direction 1D may be defined as the same direction as a folding axis direction of the elastic member 1000. In addition, the second direction may be defined as a direction perpendicular to the first direction.

One direction of the first direction 1D and the second direction 2D may be defined as a width direction of the elastic member 1000, and the other direction may be defined as a longitudinal direction of the elastic member 1000.

The elastic member 1000 may be folded with any one of the width direction and the longitudinal direction as a folding axis.

Hereinafter, for convenience of description, the first direction is defined as the same direction as the folding axis. In addition, the first direction is defined as the width direction of the elastic member 1000, and the second direction is defined as the longitudinal direction of the elastic member 1000.

The elastic member 1000 may include at least two regions. In detail, the elastic member 1000 may include a first region 1A and a second region 2A.

The first region 1A may be defined as a region where the elastic member 1000 is folded. That is, the first region 1A may be defined as a region where the elastic member 1000 and the display device 1 are folded. That is, the first region 1A may be a folding region.

In addition, the second region 2A may be defined as a region where the elastic member 1000 is not folded. That is, the second region 2A may be defined as a region where the elastic member 1000 and the display device 1 are not folded. That is, the second region 2A may be an unfolding region.

The first region 1A and the second region 2A will be described in detail below.

The display panel 2000 may be disposed on the elastic member 1000.

The display panel 2000 may include a plurality of pixels including a switching thin film transistor, a driving thin film transistor, a power storage device, and an organic light-emitting diode (OLED). In case of the organic light-emitting diode, deposition is possible at a relatively low temperature and may be mainly applied to the flexible display device for reasons of low power and high luminance. Here, the pixel refers to a minimum unit for displaying an image, and the display panel displays an image through the plurality of pixels.

The display panel may include a substrate, a gate line disposed on the substrate, a data line isolated from the gate line, and a common power line. In general, one pixel may be defined by the gate line, the data line, and the common power line as a boundary.

The substrate may include a material having flexible properties such as a plastic film, and the display panel 2000 may be implemented by disposing an organic light-emitting diode and a pixel circuit on a flexible film.

The touch panel 3000 may be disposed above the display panel 2000. The touch panel 3000 may implement a touch function in the foldable display device or the flexible display device. Alternatively, the touch panel may be omitted in a foldable display device or a flexible display device that displays only an image.

The touch panel 3000 may include a substrate and a touch electrode disposed on the substrate. The touch electrode may sense a position of an input device touched by the foldable display device or the flexible display device by a capacitive type or a resistive type.

The substrate of the touch panel 3000 may include a material having flexible properties such as a plastic film, and the touch panel 3000 may be implemented by disposing the touch electrode on the flexible film.

As described above, when the touch panel 3000 is integrally formed with the display panel 2000, the substrate of the touch panel 3000 may be a substrate of the display panel or a part of the display panel. Through this, the touch panel 3000 and the display panel 2000 can be integrally formed, and a thickness of the display device may be reduced.

Meanwhile, the elastic member 1000 and the display panel 2000 may have different sizes.

For example, an area of the elastic member 1000 may be 90% or more to 110% or less of an area of the display panel 2000. In detail, the area of the elastic member 1000 may be 95% or more to 105% or less of the area of the display panel 2000. In more detail, the area of the elastic member 1000 may be 97% or more to 100% or less of the area of the display panel 2000.

When the area of the elastic member 1000 is 90% or less of the area of the display panel 2000, support force of the elastic member 1000 supporting the display panel 2000 or the touch panel 3000 is reduced. Accordingly, a curl phenomenon or the like may occur in the unfolding region of the elastic member 1000. Accordingly, user visibility may be reduced. In addition, when a touch is driven, a malfunction of the touch may occur due to a curled region.

In addition, when the area of the elastic member 1000 increases to be 110% or more of the area of the display panel 2000, the support force for supporting the display panel or the touch panel may be secured by the elastic member 1000. However, a bezel region of a display device including the substrate, the display panel, and the touch panel may increase. Accordingly, it is impossible to provide a wide effective screen region to the user. Accordingly, the use of the display device may be inconvenient.

Meanwhile, although not shown in the drawings, a cover window protecting the foldable display device or the flexible display device may be additionally disposed above the touch panel 3000 or above the display panel 2000 (when the touch panel is omitted).

Meanwhile, the elastic member 1000, the display panel 2000, and the touch panel 3000 may be adhered to each other through an adhesive layer or the like.

As described above, the display device includes the elastic member 1000.

Referring to FIG. 2, the elastic member 1000 may be bent in one direction.

In detail, the elastic member 1000 may include a first surface 1S and a second surface 2S opposite to the first surface 1S. In the elastic member 1000, the first surface 1S or the second surface 2S may be bent to face each other. That is, in the elastic member 1000, the surfaces on which the panels are disposed may be bent to face each other. Alternatively, in the elastic member 1000, surfaces opposite to the surfaces on which the panels are disposed may be bent to face each other.

However, the embodiment is not limited thereto, and the second surface and the first surface of the elastic member 1000 may be bent to alternately face each other. That is, the elastic member 1000 may include a plurality of first regions and a plurality of second regions.

In the following description, as shown in FIG. 2, it will be mainly described that the first surfaces 1S are bent in a direction facing each other.

As described above, the elastic member 1000 may have the first region 1A and the second region 2A defined therein. The first region 1A and the second region 2A may be regions defined when the first surfaces 1S are bent in the direction facing each other.

In detail, the elastic member 1000 is bent in one direction. Accordingly, the elastic member 1000 may be divided into the first region 1A that is the folding region and the second region 2A that is the unfolding region.

Referring to FIG. 3 and FIG. 5, the elastic member 1000 may include a first region 1A that is a region where the elastic member 1000 is bent. In addition, the elastic member 1000 may include a second region 2A that is disposed adjacent to the first region 1A. The second region 2A is a region that is not bent.

For example, the second region 2A may be formed on the left and right sides of the first region 1A, respectively, based on a bending direction of the elastic member 1000. That is, the second region 2A may be disposed at both ends of the first region 1A. That is, the first region 1A may be disposed between the second regions 2A.

However, the embodiment is not limited thereto, and the first region 1A may be further formed outside the second region 2A.

The first region 1A and the second region 2A may be formed on the same elastic member 1000. That is, the first region 1A and the second region 2A may be formed integrally with each other without being separated from the same one elastic member 1000.

Sizes of the first region 1A and the second region 2A may be different from each other. In detail, the size of the second region 2A may be greater than the size of the first region 1A.

In addition, an area of the first region 1A may be 1% or more to 30% or less of an entire area of the elastic member 1000. In detail, the area of the first region 1A may be 5% or more to 20% or less of the entire area of the elastic member 1000. The area of the first region 1A may be 10% or more to 15% or less of the entire area of the elastic member 1000.

When the area of the first region 1A is less than 1% of the entire area of the elastic member 1000, cracks may occur at the interface of the folding and unfolding regions of the elastic member 1000 when the folding and restoring of the elastic member is repeated. Accordingly, folding reliability of the elastic member 10000 may be deteriorated.

In addition, when the area of the first region 1A exceeds 30% of the entire area of the elastic member 1000, curl may occur in the folding region of the display panel 2000 when the substrate is folded. Accordingly, when the user visually recognizes the screen region, the visibility may be deteriorated. In addition, when the touch is driven, the touch malfunction may occur in the touch region due to the curled region.

In the drawings, it is illustrated that the first region 1A is positioned in a central portion of the elastic member 1000, but the embodiment is not limited thereto. That is, the first region 1A may be positioned in one end and an end region of the elastic member 1000. That is, the first region 1A may be positioned at one end and the end region of the elastic member 1000 such that the size of the first region 1A is asymmetric.

FIGS. 4 and 5 are side views of the elastic member illustrating after the elastic member is folded.

Referring to FIGS. 4 and 5, the elastic member 1000 may be folded in one direction based on the folding axis. In detail, the elastic member 1000 may be folded so that the first surfaces face each other along the folding axis.

As the elastic member 1000 is folded in one direction, the elastic member 1000 may include the first region 1A and the second region 2A. That is, the elastic member 1000 may include a folding region formed as the elastic member 1000 is folded in one direction and an unfolding region positioned at both ends of the folding region.

The folding region may be defined as a region where a curvature R is formed. In addition, the unfolding region may be defined as a region where the curvature R is not formed or the curvature is close to zero.

Meanwhile, the first region 1A may be formed in various shapes.

For example, referring to FIG. 4, the curvature of the first area 1A may gradually decrease as it goes away from the folding axis FAX. That is, the radius of curvature of the first area 1A may gradually increase as it goes away from the folding axis FAX. That is, the curvature of the first area 1A may be greatest in the folding axis FAX.

Alternatively, referring to FIG. 5, the curvature of the first region 1A may gradually increase as it goes away from the folding axis FAX. That is, the radius of curvature of the first area 1A may gradually decrease as it goes away from the folding axis FAX.

That is, the curvature of the first area 1A may be the smallest in the folding axis FAX.

That is, the size of the curvature of the elastic member 1000 may decrease or increase as it goes away from the center of the folding axis.

Referring to FIGS. 3 to 5, the elastic member 1000 may be folded in one direction to be formed in an order of the unfolding region, the folding region, and the unfolding region.

A plurality of pattern portions may be formed in at least one of the first region 1A and the second region 2A. The pattern portions may reduce and distribute stress generated when the elastic member 1000 is folded. The pattern portions will be described in detail below.

Meanwhile, FIG. 4 illustrates that the first surfaces 1S of the elastic member 1000 are folded to face each other, but the embodiment is not limited thereto, and the elastic member 1000 may be folded so that the second surfaces 2S face each other.

The elastic member 1000 according to the embodiment may be folded around the folding axis. In this case, as shown in FIGS. 4 and 5, a shape of the folding region may be formed in various ways. That is, the folding region of the elastic member may be formed in various shapes according to a change in size of the curvature or the radius of curvature of the folding region.

Accordingly, when the elastic member is folded, stress generated in the folding region may vary depending on the shape of the folding region. That is, as it is far away from the folding axis according to the shape of the folding region, the stress of the folding region may increase or decrease.

Hereinafter, the elastic member capable that may effectively offset a distribution of the stress that varies depending on the shape of the folding region by controlling a size, a position, and the like of the pattern portion formed in the folding region will be described.

First, an elastic member according to a first embodiment will be described with reference to FIGS. 6 and 7.

Referring to FIGS. 6 and 7, the elastic member 1000 may include a plurality of pattern portions PA. In detail, the elastic member 1000 may include a first pattern portion PA1 disposed in the first region 1A. The elastic member 1000 may reduce compressive stress and tensile stress that are generated when folding and restoring the elastic member 1000 by the first pattern portion PA1.

The first pattern portion PA1 may be formed in a hole or groove shape.

In detail, the first pattern portion PA may be formed in a hole shape penetrating the first surface 1S and the second surface 2S opposite to the first surface 1S of the elastic member 1000. Alternatively, the first pattern portion PA may be formed in a groove shape formed on the first surface 1S or the second surface 2S.

The elastic member 1000 may be easily folded by the first pattern portion PA1 disposed in the first region 1A of the elastic member 1000. In detail, a thickness of the elastic member 1000 is reduced in the region where the elastic member 1000 is folded by the first pattern portion PA1. Accordingly, the compression stress of the folding region is reduced, and thus the elastic member 1000 may be easily folded.

The elastic member 1000 may include a hinge portion HN. In detail, a plurality of hinge portions HN may be disposed in the first region 1A of the elastic member 1000. The hinge portion HN is a region where an end region of the elastic member 1000 is opened for folding of the elastic member 1000. The hinge portion HN may be formed only in the first region 1A. Accordingly, the hinge portion HN is defined as a point at which folding of the elastic member 1000 is started. Accordingly, in the elastic member 1000, the first region 1A and the second region 2A may be divided according to whether the hinge portion is formed or not.

A plurality of columns may be defined in the first region 1A according to a position of the folding axis FAX. In detail, the first region 1A may include columns having a length direction in the first direction 1D and a width direction in the second direction 2D. The plurality of columns may include columns disposed close to the folding axis FAX in the second direction 2D and columns disposed far away therefrom in the second direction 2D.

For example, referring to FIG. 7, the first region 1A may include a first column Y1 disposed close to the folding axis FAX. In detail, the folding axis FAX may be disposed inside the first column y1.

In addition, the first region 1A may include columns Y2, Y3 . . . . Yn (n is a natural number) that are disposed farther from the folding axis FAX in the second direction 2D than the first column Y1. For example, when n is 3, the first region 1A may include a first column Y1, a second column Y2, and a third column Y3. That is, the first column Y1, the second column Y2, and the third column Y3 extending in the first direction 1D may be sequentially disposed in the second direction 2D around the folding axis.

In addition, the first region 1A may further include at least one of a fourth column Y4 and a fifth column Y5. In addition, the first region 1A may further include a sixth column, a seventh column, or more columns.

Hereinafter, for convenience of description, it will be mainly described that a case in which n is 3, that is, the first region includes the first to third columns.

The first pattern portion PA1 may include a plurality of pattern groups defined by a position of the first pattern portion PA1.

In detail, the first pattern portion PA1 may include the plurality of pattern groups defined by a distance from the folding axis FAX. The plurality of pattern groups may be disposed in each of the plurality of columns.

For example, the first pattern portion PA1 may include a first pattern group. The first pattern group may be disposed close to the folding axis FAX. In detail, the first pattern group may be disposed in the first column Y1. That is, the first pattern group may be defined as a group of a plurality of patterns P disposed to be spaced apart from the first column Y1 in the first direction 1D.

In addition, the first pattern portion PA1 may include pattern groups that are disposed farther from the folding axis FAX in the second direction 2D than the first pattern group. For example, when n is 3, the first pattern portion PA1 may include the first pattern group disposed in the first column Y1, a second pattern group disposed in the second column Y2, and a third pattern group disposed in the third column Y3.

In addition, the plurality of hinge portions described above may be disposed in the first region 1A. In detail, the hinge portion HN may include the plurality of hinge portions defined by the distance from the folding axis FAX. The plurality of hinge portions may be disposed in each of the plurality of columns.

For example, when n is 3, a first hinge portion HN1 may be disposed in the first column Y1, a second hinge portion HN2 may be disposed in the second column Y2, and a third hinge portion HN3 may be disposed in the third column Y3.

The first pattern group disposed in the first column Y1 may include a first pattern P1, the second pattern group disposed in the second column Y2 may include a second pattern P2, and the third pattern group disposed in the third column Y3 may include a third pattern P3.

The first pattern P1, the second pattern P2, and the third pattern P3 may have a length in the first direction and a width in the second direction, respectively, and the length may be greater than the width.

The first pattern P1, the second pattern P2, and the third pattern P3 may have different sizes. In detail, a first length L1 of the first pattern P1, a second length L2 of the second pattern P2, and a third length L3 of the third pattern P3 may have different sizes.

In detail, while extending from the first column toward the third column, the lengths of the patterns disposed in the columns may gradually decrease. That is, while extending from the first column Y1 toward the nth column Yn, the lengths of the patterns disposed in the columns may gradually decrease.

For example, the first length L1 of the first pattern P1 may be greater than the second length L2 of the second pattern P2. In addition, the second length L2 of the second pattern P2 may be greater than the first length L1 of the first pattern P1.

Accordingly, a size of the pattern formed in the first region 1A may gradually decrease as it goes away from the folding axis FAX in the second direction 2D. That is, in the elastic member 1000, an area of the hole or groove-shaped first pattern portion PA1 may gradually decrease as it goes away from the folding axis FAX in the second direction 2D.

The first pattern P1 disposed in the first column Y1, the second pattern P2 disposed in the second column Y2, and the third pattern P3 disposed in the third column Y3 may be disposed to overlap each other. In detail, the first pattern P1, the second pattern P2, and the third pattern P3 may be disposed to overlap in the second direction 2D.

For example, the first pattern P1 and the second pattern P2 may overlap in the second direction. In detail, the first pattern P1 and the second pattern P2 may overlap to have a first overlapping region OA1.

In addition, the second pattern P2 and the third pattern P3 may overlap in the second direction. In detail, the second pattern P2 and the third pattern P3 may overlap to have a second overlapping region OA2.

While extending from the first column Y1 toward the third column Y3, a size of the overlapping region may vary. In detail, while extending from the first column Y1 toward the third column Y3, a length of the overlapping region OA1 in the first direction 1D may decrease.

For example, the length of the first overlapping region OA1 in the first direction 1D may be greater than a length of the second overlapping region OA2 in the first direction 1D.

Accordingly, the size of the overlapping region of the patterns formed in the first region 1A may gradually decrease as it goes away from the folding axis FAX in the second direction 2D. That is, the size of the overlapping region of the patterns formed in the first region 1A may gradually increase as it approaches the folding axis FAX.

Therefore, in the elastic member 1000, the area of the hole or groove-shaped first pattern portion PA1 may gradually decrease as it goes away from the folding axis FAX in the second direction 2D. That is, in the elastic member 1000, the area of the hole or groove-shaped first pattern portion PA1 may gradually increase as it approaches the folding axis FAX.

The first hinge portion HN1 of the first column Y1, the second hinge portion HN2 of the second column Y2, and the third hinge portion HN3 of the third column Y3 may have different sizes.

In detail, the first hinge portion HN1, the second hinge portion HN2, and the third hinge portion HN3 may have different lengths. That is, the first hinge portion HN1, the second hinge portion HN2, and the third hinge portion HN3 may have lengths in the first direction 1D, and the first hinge portion HN1, the second hinge portion HN2, and the third hinge portion HN3 may have different lengths.

While extending from the first column Y1 toward the third column Y3, a size of the hinge portion may vary. In detail, while extending from the first column Y1 toward the third column Y3, a length of the hinge portion may decrease.

For example, a length of the first hinge portion HN1 may be greater than a length of the second hinge portion HN2. In addition, the length of the second hinge portion HN2 may be greater than a length of the third hinge portion HN3.

Accordingly, the size of the hinge portion formed in the first region 1A may gradually decrease as it goes away from the folding axis FAX in the second direction 2D. That is, the size of the hinge portion formed in the first region 1A may gradually increase as it approaches the folding axis FAX.

Therefore, in the elastic member 1000, an area of the hole-shaped hinge portion may gradually decrease as it goes away from the folding axis FAX in the second direction 2D. That is, in the elastic member 1000, the area of the hole-shaped hinge portion may gradually increase as it approaches the folding axis FAX.

The first hinge portion HN1 disposed in the first column Y1, the second hinge portion HN2 disposed in the second column Y2, and the third hinge portion HN3 disposed in the third column Y3 may be disposed to overlap adjacent patterns. In detail, the first hinge portion HN1, the second hinge portion HN2, and the third hinge portion HN3 may be disposed to overlap adjacent patterns in the second direction 2D.

For example, the first hinge portion HN1 disposed in the first column Y1 may overlap the second pattern P2 disposed in the second column Y2 in the second direction. In addition, the second hinge portion HN2 disposed in the second column Y2 may overlap the third pattern P3 disposed in the third column Y3 in the second direction. In addition, the third hinge portion HN3 disposed in the third column Y3 may overlap the fourth pattern P4 disposed in the fourth column Y4 in the second direction.

While extending from the first column Y1 toward the third column Y3, the size of the overlapping region may vary. In detail, while extending from the first column Y1 toward the third column Y3, the length of the hinge portion and the overlapping region of the pattern in the first direction 1D may decrease.

For example, a length of an overlapping region of the first hinge portion HN1 and the second pattern P2 in the first direction 1D may be greater than a length of an overlapping region of the second hinge portion HN2 and the third pattern P3 in the first direction 1D.

In addition, the length of the overlapping region of the second hinge portion HN2 and the third pattern P3 in the first direction 1D may be greater than a length of an overlapping region of the third hinge portion HN3 and the fourth pattern P4 in the first direction 1D.

Accordingly, the size of the overlapping region of the hinge portion and the pattern formed in the first region 1A may gradually decrease as it goes away from the folding axis FAX in the second direction 2D. That is, the size of the overlapping region of the pattern and the hinge formed in the first region 1A may gradually increase as it approaches the folding axis FAX.

Therefore, in the elastic member 1000, areas of the hole or groove-shaped first pattern portion PA1 and the hinge portion may gradually decrease as it goes away from the folding axis FAX in the second direction 2D. That is, in the elastic member 1000, the areas of the hole or groove-shaped first pattern portion PA1 and the hinge portion may gradually increase as it approaches the folding axis FAX.

The elastic member according to the first embodiment may change the size of the pattern and the hinge portion disposed in each column according to the distance from the folding axis.

In detail, as it goes away from the folding axis, the length of the pattern and the length of the hinge portion may be decreased. In addition, as it goes away from the folding axis, the length of the overlapping region of the patterns and the length of the overlapping region of the hinge portion may be decreased.

Accordingly, in the elastic member according to the first embodiment, the area of the first pattern portion and the area of the hinge portion including the pattern may increase as it approaches the folding axis. Therefore, in the elastic member according to the first embodiment, the area of the first pattern portion configured to relieve stress according to the shape of the first region that is the folding region of may be controlled.

That is, as shown in FIG. 4, when the first region of the elastic member according to the first embodiment is formed in a shape in which the curvature decreases, that is, the radius of curvature increases as it goes away from the folding axis, it is possible to improve the folding reliability and the flatness of the elastic member.

That is, by forming the area of the first pattern portion and the hinge portion to be decreased as it goes away from the folding axis of the elastic member, it is possible to stably secure the folding reliability by the first pattern portion and the hinge portion in a folding region where the stress is large. In addition, in a folding region where the stress is small, it is possible to improve the elasticity of the elastic member by reducing the sizes of the first pattern portion and the hinge portion of the elastic member, thereby improving the flatness of the elastic member in an unfolded state.

Hereinafter, an elastic member according to a second embodiment will be described with reference to FIGS. 8 and 9.

Referring to FIGS. 8 and 9, the first pattern P1, the second pattern P2, and the third pattern P3 may have different sizes. In detail, the first length L1 of the first pattern P1, the second length L2 of the second pattern P2, and the third length L3 of the third pattern P3 may have different sizes.

In detail, while extending from the first column toward the third column, the lengths of the patterns disposed in the columns may gradually increase. That is, while extending from the first column Y1 toward the nth column Yn, the lengths of the patterns disposed in the columns may gradually increase.

For example, the first length L1 of the first pattern P1 may be greater than the second length L2 of the second pattern P2. In addition, the second length L2 of the second pattern P2 may be greater than the first length L1 of the first pattern P1.

Accordingly, the size of the pattern formed in the first region 1A may gradually increase as it goes away from the folding axis FAX in the second direction 2D. That is, in the elastic member 1000, the area of the hole or groove-shaped first pattern portion PA1 may gradually increase as it goes away from the folding axis FAX in the second direction 2D.

The first pattern P1 disposed in the first column Y1, the second pattern P2 disposed in the second column Y2, and the third pattern P3 disposed in the third column Y3 may be disposed to overlap each other. In detail, the first pattern P1, the second pattern P2, and the third pattern P3 may be disposed to overlap in the second direction 2D.

For example, the first pattern P1 and the second pattern P2 may overlap in the second direction. In detail, the first pattern P1 and the second pattern P2 may overlap to have a first overlapping region OA1.

In addition, the second pattern P2 and the third pattern P3 may overlap in the second direction. In detail, the second pattern P2 and the third pattern P3 may overlap to have a second overlapping region OA2.

While extending from the first column Y1 toward the third column Y3, a size of the overlapping region may vary. In detail, while extending from the first column Y1 toward the third column Y3, a length of the overlapping region OA1 in the first direction 1D may increase.

For example, the length of the first overlapping region OA1 in the first direction 1D may be smaller than a length of the second overlapping region OA2 in the first direction 1D.

Accordingly, the size of the overlapping region of the patterns formed in the first region 1A may gradually increase as it goes away from the folding axis FAX in the second direction 2D. That is, the size of the overlapping region of the patterns formed in the first region 1A may gradually decrease as it approaches the folding axis FAX.

Therefore, in the elastic member 1000, the area of the hole or groove-shaped first pattern portion PA1 may gradually increase, as it goes away from the folding axis FAX in the second direction 2D. That is, in the elastic member 1000, the area of the hole or groove-shaped first pattern portion PA1 may gradually decrease as it approaches the folding axis FAX.

The first hinge portion HN1 of the first column Y1, the second hinge portion HN2 of the second column Y2, and the third hinge portion HN3 of the third column Y3 may have different sizes.

In detail, the first hinge portion HN1, the second hinge portion HN2, and the third hinge portion HN3 may have different lengths. That is, the first hinge portion HN1, the second hinge portion HN2, and the third hinge portion HN3 may have lengths in the first direction 1D, and the first hinge portion HN1, the second hinge portion HN2, and the third hinge portion HN3 may have different lengths.

While extending from the first column Y1 toward the third column Y3, a size of the hinge portion may vary. In detail, while extending from the first column Y1 toward the third column Y3, a length of the hinge portion may increase.

For example, a length of the first hinge portion HN1 may be smaller than a length of the second hinge portion HN2. In addition, the length of the second hinge portion HN2 may be smaller than a length of the third hinge portion HN3.

Accordingly, the size of the hinge portion formed in the first region 1A may gradually increase as it goes away from the folding axis FAX in the second direction 2D. That is, the size of the hinge portion formed in the first region 1A may gradually decrease as it approaches the folding axis FAX.

Therefore, in the elastic member 1000, an area of the hole-shaped hinge portion may gradually increase as it goes away from the folding axis FAX in the second direction 2D. That is, in the elastic member 1000, the area of the hole-shaped hinge portion may gradually decrease as it approaches the folding axis FAX.

The first hinge portion HN1 disposed in the first column Y1, the second hinge portion HN2 disposed in the second column Y2, and the third hinge portion HN3 disposed in the third column Y3 may be disposed to overlap adjacent patterns. In detail, the first hinge portion HN1, the second hinge portion HN2, and the third hinge portion HN3 may be disposed to overlap adjacent patterns in the second direction 2D.

For example, the first hinge portion HN1 disposed in the first column Y1 may overlap the second pattern P2 disposed in the second column Y2 in the second direction. In addition, the second hinge portion HN2 disposed in the second column Y2 may overlap the third pattern P3 disposed in the third column Y3 in the second direction. In addition, the third hinge portion HN3 disposed in the third column Y3 may overlap the fourth pattern P4 disposed in the fourth column Y4 in the second direction.

While extending from the first column Y1 toward the third column Y3, the size of the overlapping region may vary. In detail, while extending from the first column Y1 toward the third column Y3, the length of the hinge portion and the overlapping region of the pattern in the first direction 1D may increase.

For example, a length of an overlapping region of the first hinge portion HN1 and the second pattern P2 in the first direction 1D may be smaller than a length of an overlapping region of the second hinge portion HN2 and the third pattern P3 in the first direction 1D.

In addition, the length of the overlapping region of the second hinge portion HN2 and the third pattern P3 in the first direction 1D may be smaller than a length of an overlapping region of the third hinge portion HN3 and the fourth pattern P4 in the first direction 1D.

Accordingly, the size of the overlapping region of the hinge portion and the pattern formed in the first region 1A may gradually increase as it goes away from the folding axis FAX in the second direction 2D. That is, the size of the overlapping region of the pattern and the hinge formed in the first region 1A may gradually decrease as it approaches the folding axis FAX.

Therefore, in the elastic member 1000, areas of the hole or groove-shaped first pattern portion PA1 and the hinge portion may gradually increase as it goes away from the folding axis FAX in the second direction 2D. That is, in the elastic member 1000, the areas of the hole or groove-shaped first pattern portion PA1 and the hinge portion may gradually decrease as it approaches the folding axis FAX.

The elastic member according to the second embodiment may change the size of the pattern and the hinge portion disposed in each column according to the distance from the folding axis.

In detail, as it goes away from the folding axis, the length of the pattern and the length of the hinge portion may be increased. In addition, as it goes away from the folding axis, the length of the overlapping region of the patterns and the length of the overlapping region of the hinge portion may be increased.

Accordingly, in the elastic member according to the second embodiment, the area of the first pattern portion and the area of the hinge portion including the pattern may decrease as it approaches the folding axis. Therefore, in the elastic member according to the second embodiment, the area of the first pattern portion configured to relieve stress according to the shape of the first region that is the folding region of may be controlled.

That is, in the elastic member according to the second embodiment, when the first region is formed in a shape in which the curvature increases, that is, the radius of curvature decreases as it goes away from the folding axis, it is possible to improve the folding reliability and the flatness of the elastic member.

That is, by forming the area of the first pattern portion and the hinge portion to be increased as it goes away from the folding axis of the elastic member, it is possible to improve the elasticity of the elastic member by reducing the sizes of the first pattern portion and the hinge portion of the elastic member in a folding region where the stress is small, thereby improving the flatness of the elastic member in an unfolded state. In addition, in a folding region where the stress is large, it is possible to stably secure the folding reliability by the first pattern portion and the hinge portion.

Meanwhile, it is illustrated in FIGS. 6 and 8 that the pattern portion is formed only in the first region that is the folding region, but the embodiment is not limited thereto, and the pattern portion may also be disposed in the second region that is the unfolding region.

For example, the elastic member 1000 may further include a second pattern portion disposed in the second region 2A.

The second pattern portion PA2 may be formed in a hole or groove shape.

In detail, the second pattern portion may be formed in a hole shape penetrating the first surface 1S and the second surface 2S of the elastic member 1000. Alternatively, the second pattern portion may be formed in a groove shape formed on the first surface 1S or the second surface 2S.

The second pattern portion disposed in the second region 2A, which is a region where the elastic member 1000 is not folded, may maintain similar physical characteristics of the first region 1A and the second region 2A.

In detail, a difference in deformation due to heat in the first region 1A and the second region 2A in which the first pattern portion PA1 is disposed may be reduced by the second pattern portion PA2. That is, when heat is applied to the elastic member 1000, the difference in deformation due to heat in the first region 1A and the second region 2A may be relieved by forming pattern portions in both the first region 1A and the second region 2A. Accordingly, it is possible to prevent the elastic member 1000 from being bent or twisted due to the difference in deformation between the first region 1A and the second region 2A.

In addition, it is possible to prevent bending of the elastic member by relieving unevenness of the stress between the first region 1A and the second region 2A by the second pattern portion formed in the second region 2A.

The second pattern portion PA2 may be formed in a shape the same as or similar to that of the first pattern portion PA1. In detail, the second pattern portion PA2 may be formed in a shape having a longitudinal direction and a transverse direction, a longitudinal direction of the second pattern portion PA1 and a longitudinal direction of the first pattern portion PA1 may extend the same or similar directions to each other, and a transverse direction of the second pattern portion PA2 and a transverse direction of the first pattern portion PA1 may extend in the same or similar directions to each other.

Hereinafter, an elastic plate 10 including the elastic member 1000 described above will be described with reference to FIGS. 10 to 12.

FIGS. 10 to 12 are cross-sectional views for describing a layer structure of the elastic plate 10.

Referring to FIG. 10, the elastic plate 10 may include an elastic member 1000, a planarization layer 2000, and an adhesive layer 3000.

The elastic member 1000 may include a metal. In detail, the elastic member 1000 may include a metal or a metal alloy. For example, the elastic member 1000 may include SUS or copper (Cu). Alternatively, the elastic member 1000 may be formed of an alloy including at least one of nickel (Ni), chromium (Cr), iron (Fe), titanium (Ti), manganese (Mn), molybdenum (Mo), silver (Ag), zinc (Zn), nitrogen (N), and aluminum (Al) together with copper (Cu).

The planarization layer 2000 may be disposed on the elastic member 1000.

The planarization layer 2000 may be disposed on the elastic member 1000 to serve to planarize a surface of the elastic member 1000. As described above, a plurality of pattern portions in a hole or groove shape may be formed in the elastic member 1000 and the surface of the elastic member 1000 may not be flat due to the pattern portions. Accordingly, when a panel or the like is directly adhered to the elastic member 1000, the adhesion to the panel may be deteriorated due to surface characteristics of the elastic member 1000.

Accordingly, the elastic plate 10 may dispose the planarization layer 2000 on the elastic member 1000 to flatten an adhesive surface on which the elastic plate 10 is adhered to the panel.

The planarization layer 2000 may include a metal or a non-metal. In detail, the planarization layer 2000 may include a metal or plastic. The planarization layer 2000 may include different materials according to characteristics to be implemented in folding characteristics and strength among characteristics of the elastic plate 10.

For example, the planarization layer 2000 may include plastic. For example, the planarization layer 2000 may include polyimide (PI), but the embodiment is not limited thereto.

The adhesive layer 3000 may be disposed between the elastic member 1000 and the planarization layer 2000. The adhesive layer 3000 may be disposed between the elastic member 1000 and the planarization layer 2000 to adhere the elastic member 1000 and the planarization layer 2000.

Referring to FIGS. 11 and 12, the elastic member 1000 may be formed in multiple layers.

Referring to FIGS. 11 and 12, the elastic member 1000 may include a first layer 1100 and a second layer 1200 on the first layer 1100.

The first layer 1100 and the second layer 1200 may include a metal material. In detail, the first layer 1100 and the second layer 1200 may include different metal materials.

For example, the first layer 1100 and the second layer 1200 may include materials having different thermal conductivity. In detail, the first layer 1100 may include a material having thermal conductivity higher than that of the second layer 1200.

In addition, the first layer 1100 and the second layer 1200 may include materials having different yield strengths. In detail, the second layer 1200 may include a material having a yield strength higher than that of the first layer 1100.

For example, the first layer 1100 may include copper or a copper alloy, and the second layer 1200 may include SUS, but the embodiment is not limited thereto, and the first layer 1100 and the second layer 1200 may include various materials satisfying the thermal conductivity and the yield strength.

In addition, the first layer 1100 and the second layer 1200 may be disposed in direct contact with each other. In detail, the first layer 1100 and the second layer 1200 may be manufactured in a clad method.

Clad bonding is a method of bonding the first layer 1100 and the second layer 1200 by a method such as welding, rolling, casting, or extrusion without bonding using an adhesive, and it is possible to show better bonding force over time by destroying a mutual organization of each layer and stabilizing the bonding of each layer through interstitial penetration.

For example, the bonding may be formed by inducing atomic diffusion between dissimilar materials at a layer interface of different layers through rolling. Since the clad bonding may process curved surfaces unlike bonding using an adhesive and uses atomic diffusion bonding rather than bonding using the adhesive, it has an advantage of being able to maintain a bonded state for a long time.

The first layer 1100 and the second layer 1200 may be disposed to have the same or different thicknesses. For example, when it is desired to improve heat dissipation characteristics of the elastic plate 10, a thickness of the first layer 1100 may be disposed to be greater than a thickness of the second layer 1200. Alternatively, in order to improve folding properties of the elastic plate 10, the thickness of the second layer 1200 may be greater than the thickness of the first layer 1100.

That is, the thickness of the first layer 1100 and the thickness of the second layer 1200 may vary according to characteristics to be implemented in the elastic plate 10.

Referring to FIG. 12, the elastic member 1000 may include a first layer 1100, a second layer 1200 on the first layer 1100, and a third layer 1300 on the second layer 1200.

The first layer 1100, the second layer 1200, and the third layer 1300 may include a metal material. In detail, the first layer 1100, the second layer 1200, and the third layer 1300 may include the same or different metal materials.

For example, the first layer 1100 and the third layer 1300 may include the same material from each other, and the second layer 1200 may include a material different from those of the first layer 1100 and the third layer 1300.

The first layer 1100, the third layer 1300, and the second layer 1200 may include materials having different thermal conductivity. In detail, the first layer 1100 and the third layer 1300 may include a material having thermal conductivity higher than that of the first second layer 1200.

In addition, the first layer 1100, the third layer 1300, and the second layer 1200 may include materials having different yield strengths. In detail, the first second layer 1200 may include a material having a yield strength higher than those of the first layer 1100 and the third layer 1300.

For example, the first layer 1100 and the third layer 1300 may include copper or a copper alloy, and the first second layer 1200 may include SUS, but the embodiment is not limited thereto, and the first layer 1100, the second layer 1200, and the third layer 1300 may include various materials satisfying the thermal conductivity and the yield strength.

In addition, the first layer 1100, the second layer 1200, and the third layer 1300 may be disposed in direct contact with each other. In detail, the first layer 1100, the second layer 1200, and the third layer 1300 may be manufactured by the clad method described above.

The first layer 1100, the second layer 1200, and the third layer 1300 may be disposed to have the same or different thicknesses from each other. For example, when it is desired to improve the heat dissipation characteristics of the elastic plate 10, the thickness of the first layer 1100 and the thickness of the third layer 1300 may be disposed to be greater than the thickness of the second layer 1200. Alternatively, when it is desired to improve the folding properties of the elastic plate 10, the thickness of the second layer 1200 may be disposed to be greater than those of the first layer 1100 and the third layer 1300.

That is, the thickness of the first layer 1100, the thickness of the first second layer 1200, and the thickness of the third layer 1300 may vary depending on the properties to be implemented in the elastic plate 10.

Consequently, the first layer of the elastic member may include at least one of the first layer, the second layer, and the third layer.

FIGS. 13 and 14 are views for describing arrangement relationship of the adhesive layer 3000.

Referring to FIG. 13, the adhesive layer 3000 may be disposed on an upper surface of the elastic member 1000. In detail, after disposing the adhesive layer 3000 on the elastic member 1000 and disposing the planarization layer 2000 on the adhesive layer 3000, the elastic member 1000 and the planarization layer 2000 may be adhered through the adhesive layer 3000 by applying pressure onto the planarization layer 2000.

In this case, the adhesive layer 3000 is not disposed inside the first pattern portion PA1 and the second pattern portion PA2 formed on the elastic member 1000, but the adhesive layer 3000 may be disposed only on the upper surface of the elastic member 1000.

Since the adhesive layer is not disposed inside pattern portions of the elastic member 1000, when the elastic plate is applied to the display device, refraction and total reflection of light according to the adhesive layer may be minimized, and thus light transmittance may be improved.

Alternatively, referring to FIG. 14, the adhesive layer 3000 may be disposed on the upper surface of the elastic member 1000. In detail, the adhesive layer 3000 may be disposed inside the first pattern portion PA1 and the second pattern portion PA2 of the elastic member 1000. In detail, as shown in FIG. 14, the adhesive layer 3000 may be disposed to completely fill the inside of the first pattern portion PA1 and the second pattern portion PA2 or may be disposed to partially fill the inside of the first pattern portion PA1 and the second pattern portion PA2.

In detail, after disposing the adhesive layer 3000 on the elastic member 1000 and disposing the planarization layer 2000 on the adhesive layer 3000, the adhesive layer 3000 may adhere the elastic member 1000 and the planarization layer 2000 while applying pressure onto the planarization layer 2000 and completely filling or partially filling the inside of the first pattern portion PA1 and the second pattern portion PA2.

Since the adhesive layer is disposed inside the pattern portions of the elastic member, when adhering the elastic member and the planarization layer through the adhesive layer, it is possible to improve the adhesive properties by making an area to which the pressure is applied uniform in the first region and the second region of the elastic member.

In addition, it is possible to prevent impurities from penetrating through the pattern portions of the elastic member.

Hereinafter, a folding support including the elastic plate according to the embodiment described above will be described with reference to FIGS. 15 and 16.

Referring to FIGS. 15 and 16, the folding support may include the elastic plate and a protective layer 4000. FIG. 15 is a view illustrating a folding support in which the adhesive layer is not disposed inside the pattern portion of the elastic member, and FIG. 16 is a view illustrating a folding support in which the adhesive layer formed of a plurality of layers is disposed inside the pattern portion of the elastic member.

The folding support may include the above-described elastic plate 10 and the protective layer 4000 disposed under the elastic plate 10. In detail, the protective layer 4000 may be disposed under the elastic member 1000 or the first layer 1100 of the elastic plate 10.

Although not shown in the drawings, an adhesive layer may be disposed between the protective layer 4000 and the elastic member 1000 or between the protective layer 4000 and the first layer 1100, and the elastic member 1000 and the protective layer 4000 may be adhered through the adhesive layer.

The protective layer 4000 may have a color. For example, the protective layer 4000 may be formed in a black-based color.

The protective layer 4000 may include metal particles. For example, the protective layer 4000 may include copper particles. Accordingly, heat generated in the display device may be dissipated through the protective layer 4000 by improving thermal conductivity of the protective layer 4000.

The protective layer 4000 may be disposed in one region of the elastic plate 10. In detail, the protective layer 4000 may be disposed in a region corresponding to the first region 1A of the elastic plate 10. Alternatively, the protective layer 4000 may be disposed in a region corresponding to the first region 1A and the second region 2A of the elastic plate 10.

For example, the protective layer 4000 may be disposed in a region corresponding to the first region 1A and the second region 2A of the elastic plate 10 and may be disposed in an area smaller than the sum of areas of the first region 1A and the second region 2A. In detail, the protective layer 4000 may be disposed in an area of 80% to 90% of the sum of the areas of the first region 1A and the second region 2A of the elastic member.

In addition, a thickness of the protective layer 4000 may be smaller than the overall thickness of the elastic plate 10. That is, the thickness of the protective layer 4000 may be smaller than the sum of thicknesses of the elastic member, the adhesive layer, and the planarization layer of the elastic plate 10.

Hereinafter, a display device including the folding support according to the embodiment described above will be described with reference to FIGS. 17 and 18.

Referring to FIGS. 17 and 18, a display device 1 may include the folding support and the panel. FIG. 17 is a view illustrating a display device in which the adhesive layer of the elastic plate is not disposed inside the pattern portion of the elastic member, and FIG. 18 is a view illustrating a display device in which the adhesive layer formed of a plurality of layers is disposed inside the pattern portion of the elastic member.

The display device 1 may include the folding support and a panel layer 6000 that is disposed on the folding support and includes a display panel and/or a touch panel.

The folding support may include the elastic plate 10 including the elastic member 1000, the planarization layer 2000, and the adhesive layer 3000 described above and the protective layer 4000 disposed under the elastic plate 10. In detail, the protective layer 4000 may be disposed under the elastic member 1000 or the first layer 1100 of the elastic plate 10.

An adhesive layer 5000 may be disposed between the elastic plate 10 and the panel layer 6000, and the elastic plate 10 may be adhered to the panel layer 6000 through the adhesive layer 500.

As described above, since the elastic plate 10 may planarize an adhesive surface of the elastic member by the planarization layer 2000, the elastic member and the panel layer may be stably adhered to each other without being affected by a step difference.

The adhesive layer 5000 between the elastic plate 10 and the panel layer 6000 may have different properties from the adhesive layer 3000 of the elastic plate 10.

In detail, the adhesive layer 5000 may have a thickness smaller than that of the adhesive layer 3000. For example, the thickness of the adhesive layer 5000 may be 5 μm to 15 μm.

In addition, the adhesive layer 5000 may have smaller adhesive properties than the adhesive layer 3000. In detail, an adhesive force of the adhesive layer 5000 may be 400 or less.

In addition, the adhesive layer 5000 and the adhesive layer 3000 may have different elastic moduli. That is, the adhesive layer 5000 does not have an elastic modulus having a storage modulus, creep & recovery and a tangent delta value like the adhesive layer, whereby the adhesive layer 5000 may not have elastic properties other than adhesive properties.

FIG. 19 is a view for describing an example in which the elastic member according to the embodiments is applied.

Referring to FIG. 19, the elastic member according to the embodiments may be applied to a flexible or foldable display device for displaying a display.

For example, the elastic member according to the embodiments may be applied to a flexible display device such as a mobile phone or a tablet.

Such an elastic member may be applied to a flexible display device such as a mobile phone or a tablet that is flexible, bent, or folded.

The elastic member is applied to the flexible display device such as the mobile phone or the tablet that is flexible, bent or folded and improves the folding reliability in a display device that is repeatedly folded or folded, thereby improving the reliability of the flexible display device.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present disclosure.

In addition, embodiments are mostly described above, but the embodiments are merely examples and do not limit the present disclosure, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present disclosure defined in the following claims.

What is claimed is:

1. An elastic member foldable based on a folding axis comprising:

wherein the elastic member is defined in a first direction corresponding to the folding axis and a second direction perpendicular to the first direction and includes a plurality of pattern parts spaced apart along the second direction, wherein each of the plurality of pattern parts includes a plurality of patterns spaced apart from each other along the first direction, wherein the elastic member includes a first side surface and a second side surface located in the first direction, wherein the plurality of pattern parts include:

a plurality of first pattern groups provided at one side of the folding axis and spaced apart from each other along the second direction, and a plurality of second pattern groups disposed between the plurality of first pattern groups, wherein each of the plurality of first pattern groups includes a first outer pattern that is not connected to the first side surface and is closest to the first side surface, wherein the first outer patterns of the plurality of first pattern groups have different lengths in the first direction, wherein each of the plurality of second pattern groups includes a second outer pattern that is not connected to the first side surface and is closest to the first side surface, wherein the second outer patterns of the plurality of second pattern groups have different lengths in the first direction, wherein the plurality of first outer patterns are provided at different first separation distances from the first side surface in the first direction, wherein the plurality of second outer patterns are provided at different second separation distance from the first side surface in the first direction, and wherein the first separation distance is smaller than the second separation distance.

2. The elastic member of claim 1, a length in the first direction of a first outer pattern closest to the folding axis among the plurality of first outer patterns is greater than a length of a second outer pattern closest to the folding axis among the plurality of second outer patterns.

3. The elastic member of claim 1, wherein the lengths of the plurality of first outer patterns in the first direction becomes smaller as a distance from the folding axis increases.

4. The elastic member of claim 1, wherein the lengths of the plurality of second outer patterns in the first direction becomes smaller as a distance from the folding axis increases.

5. The elastic member of claim 1, wherein each of the plurality of first outer patterns has a central axis in the first direction, and wherein distances in the first direction from the first side surface to the central axis of the plurality of first outer patterns is the same.

6. The elastic member of claim 5, wherein the central axes of each of the plurality of first outer patterns overlap each other along the second direction.

7. The elastic member of claim 1, wherein each of the plurality of second outer patterns has a central axis in the first direction, and wherein distances in the first direction from the first side surface to the central axis of the plurality of second outer patterns is the same.

8. The elastic member of claim 7, wherein central axes of each of the plurality of second outer patterns overlap each other along the second direction.

9. A folding support comprising:

the elastic member of claim 1;

a planarization layer disposed on the elastic member;

an adhesive layer between the elastic member and the planarization layer; and a protective layer disposed under the elastic member.

10. A display device comprising:

the elastic member of claim 1;

a planarization layer disposed on the elastic member;

a first adhesive layer between the elastic member and the planarization layer;

a protective layer disposed under the elastic member;

a second adhesive layer on the planarization layer; and a panel layer on the second adhesive layer, wherein the panel layer includes at least one of a display panel and a touch panel.

11. The elastic member of claim 1, wherein a smallest separation distances of the second separation distances is greater than a greatest first separation distance of the first separation distances.

12. The elastic member of claim 1, wherein the first separation distance increases as a distance from the folding axis increases.

13. The elastic member of claim 1, wherein the second separation distance increases as a distance from the folding axis increases.

14. The elastic member of claim 1, wherein the plurality of first outer patterns and the plurality of second outer patterns have overlapping regions that overlap along the second direction, and wherein lengths of the overlapping regions in the first direction becomes smaller as a distance from the folding axis increases.

15. The elastic member of claim 1, wherein a separation distance between the plurality of first outer patterns in the second direction is the same as each other.

16. The elastic member of claim 15, wherein a separation distance between the plurality of second outer patterns in the second direction is the same as each other.

* * * * *